United States Patent [19]

Gabuzda

[11] Patent Number: 4,753,290

[45] Date of Patent: Jun. 28, 1988

[54] REDUCED-STRESS HEAT SINK DEVICE

[75] Inventor: Paul G. Gabuzda, Laguna Beach, Calif.

[73] Assignee: Unisys Corporation, Detroit, Mich.

[21] Appl. No.: 886,994

[22] Filed: Jul. 18, 1986

[51] Int. Cl.[4] ............................................... F28F 7/00
[52] U.S. Cl. ............................... 165/185; 174/16 HS; 357/81
[58] Field of Search ............... 165/185, 80.3, 80.4; 174/16 HS; 357/81

[56] References Cited

U.S. PATENT DOCUMENTS

| | | | |
|---|---|---|---|
| 3,242,984 | 3/1966 | Delpeyrow et al. | 165/185 |
| 3,262,028 | 7/1966 | Hermann | 165/80.3 X |
| 3,313,339 | 4/1967 | Coe | 165/80.3 |
| 3,327,776 | 6/1967 | Butt | 174/16 HS X |
| 3,342,255 | 9/1967 | Risk et al. | 174/16 HS X |
| 3,566,958 | 3/1971 | Zelina | 165/185 X |
| 3,592,260 | 7/1971 | Berger | 165/185 X |
| 3,716,098 | 2/1973 | Dotto | 165/80.3 |
| 4,144,932 | 3/1979 | Voigt | 165/185 X |
| 4,620,216 | 10/1986 | Horvath | 357/81 |

OTHER PUBLICATIONS

"Pin Array Package with Heat Removal from Pin Side", Hedeman & Richards, IBM Tech. Bulletin, vol. 14, No. 11, Apr., 1972, p. 3349.

Primary Examiner—Ira S. Lazarus
Assistant Examiner—Peggy H. Neils
Attorney, Agent, or Firm—Alfred W. Kozak; Nathan Cass; L. Joseph Marhoefer

[57] ABSTRACT

A heat sink for adhesive attachment to an integrated circuit package has a base plate with gapped areas dividing the plate into sectors. A series of radial fin elements extend from the base plate except at the gapped areas where a bridging fin element spans the gap to effectively help reduce the stresses caused by heat cycling and permit the adhesive bond to be relatively undisturbed.

3 Claims, 3 Drawing Sheets

4,753,290

1

REDUCED-STRESS HEAT SINK DEVICE

CROSS REFERENCES TO RELATED APPLICATIONS

This application is related to a copending application entitled Staggered "Radial Fin Heat Sink" Device for Integrated Circuit Package by inventors Paul G. Gabuzda and Sanford Victor Terrell, filed in the U.S. Pat. Office on June 30, 1986 as U.S. Ser. No. 880,427. This application issued as U.S. Pat. No. 4,715,438 on Dec. 29, 1987.

FIELD OF THE INVENTION

This disclosure relates to developments in the use of heat sink devices for use with integrated circuit packages.

BACKGROUND OF THE INVENTION

One of the recurring problems occurring in the adhesive attachment of heat sinks to integrated circuit packages is the fact that thermal cycles which occur during the heating and cooling of the heat sink will cause expansion and contraction of the baseplate which attaches to the integrated circuit package and relative to the package.

The accumulative effect of this thermal cycling is to weaken, or loosen or deteriorate the bond that occurs between the actual heat sink itself and the integrated circuit package which may lead to a complete breakdown in the thermal and mechanical connection between the integrated circuit package and the heat sink.

In consideration of the recurring type problems which occur in degradation of the thermal conduction between the heat sink and the integrated circuit package, an improved design of a thermally efficient heat sink is herein disclosed wherein the heat cycling stresses between the integrated circuit package and the heat sink itself have been minimized to a considerable extent, thus prolonging the life and quality of the heat conducting attachment as between the integrated circuit package and the heat sink.

SUMMARY OF THE INVENTION

The present disclosure involves an IC attachable heat sink having variable length radially oriented fins placed on a baseplate having a square configuration divided into sectors.

The fins are grouped into sectors such that four sectors are provided on the square base and whereby each sector is separated by a spatial gap from the adjacent sectors using a bridging fin arrangement shaped as an inverted letter "U" which permits an accordion-like expansion or contraction to occur in the metallic portions of the heat sink without excessively straining the baseplate area which is attached to the integrated circuit package.

DESCRIPTION OF A PREFERRED EMBODIMENT

Figure 1:
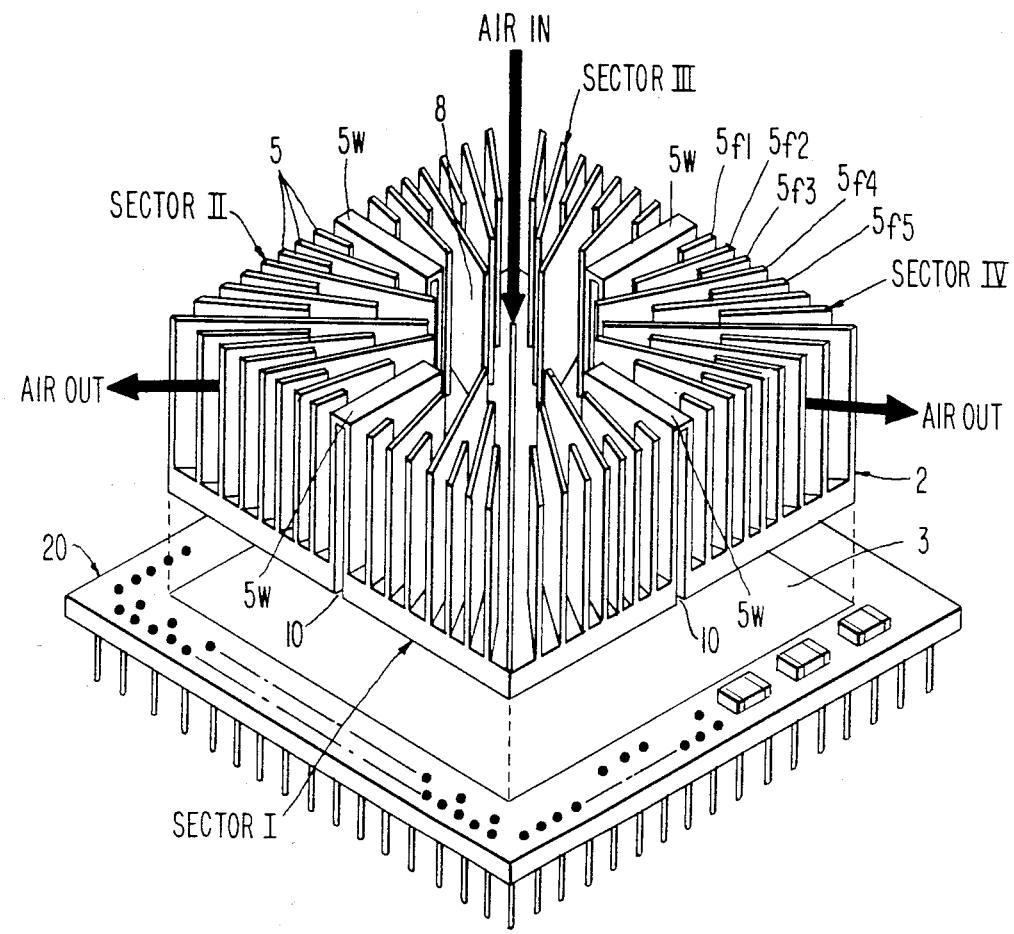
FIG. 1 is a perspective view of the square based heat sink and the integrated circuit package to which it attaches.

Referring to FIG. 1 there is seen a perspective view of the disclosed square configuration, radial-fin heat sink having four sectored areas. There are designated as sector I, sector II, sector III, and sector IV.

As will be seen in FIG. 1, each sector is composed of radial oriented fin elements which are patterned of variable lengths such as shown by the fin elements $5_{f1}$, $5_{f2}$, $5_{f3}$, $5_{f4}$, $5_{f5}$, etc.

These fins are staggered in an alternate fashion so that a long length fin is adjacent to a short length fin which is then adjacent to an intermediate length fin which is adjacent to a short length fin after which there appears a long length fin. Then this pattern is repeated with alternating short length, intermediate length and long length fins in order to provide an unusually high surface area for presentation to the flow of impinging cool air through the aperture area 8.

The heat sink 1 in its overall manufacture is a single, diecast piece.

The baseplate or spreader plate 2 will be seen to be designed such that each quadrant is separated by a space 10 from the next adjacent quandrant and each of the quadrants is bridged from the adjacent quadrant by a U-shaped bridge fin $5_w$. The advantage of this configuration lies in the reduction of the maximum movement from the neutral axis, since when the heat sink 1 is adhesively attached to the integrated circuit package 20, then a significant amount of relative expansion of the heat sink is taken up by the linked joining fins $5_w$.

Thus, there is provided a considerable reduction in the maximum shear strain in the heat sink/substrate interface.

Figure 2:
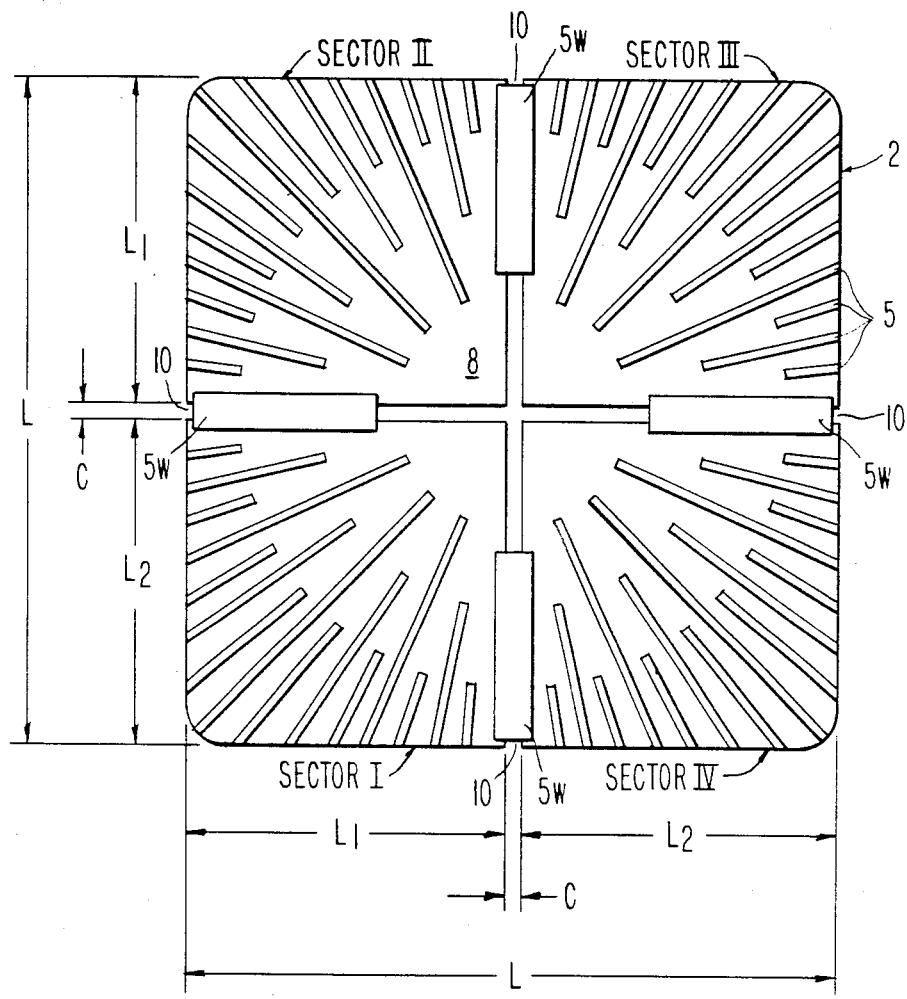
FIG. 2 is a top plan view of the heat sink indicating the various sectors.

FIG. 2 shows a top plan view of the base plate 2 which supports the radial array of fin elements, 5.

The base plate 2 is divided into four sectors which are set off from each other through the cutout areas 10 which divide the base plate 2 into quadrants.

Thus, sector I provides the first quadrant, then (counter-clockwise) sector II provides the second quadrant and likewise sectors III and IV constitute the remaining quadrants.

Due to the cutout sections 10 shown in FIG. 2, the expansion and contraction effects due to heating and cooling cycles are minimized since the peripheral distance along any one side of the quadrant is made substantially shorter by the cutout 10.

Thus in FIG. 2 the overall side-length L, when undergoing heating and cooling cycles would have a rather large expansion and contraction deviation were it not for the cutout area 10 having a linear distance C.

Because of the linear cutout C the overall side length L is split into two subsections designated L1 and L2. Each of these subsections L1 and L2 when undergoing heating and cooling cycles will have a much smaller displacement than what would be the case if the overall length L was used.

The central area 8 of FIG. 2 is the inner circumference of the longest length fin elements which encompass a central air channel or aperture area 8 through which air can be impinged.

Sector I shows an illustration of how a long length fin element is alternated with a short length fin element, a medium length fin element and another short length fin element in a repetitive pattern.

Figure 3:
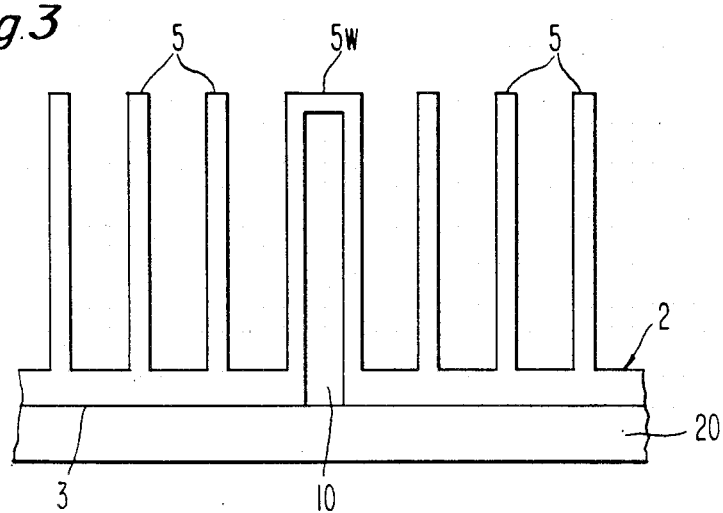
FIG. 3 is a schematic side view of the heat sink showing the contact surface to the IC package.

FIG. 3 shows a side view of the base plate 2 having radial fins 5 on each side of the central bridge fin $5_w$. The central bridge fin $5_w$ provides a metallic surface 5 which bridges the gap 10. The bridge fin 5 operates to provide the gap 10 which reduces the length of the sides of the contact area 3.

Thus each gap area 10 is linked by an accordion-like bridge fin which provides capability of expansion and contraction of base plate 2 without substantial stress to the integrated circuit package surface 3 so that the adhesive or connective areas will not be displaced to the deleterious extent that the contact area connection could be severed, broken, or degraded in effectiveness of heat conduction.

Figure 4:
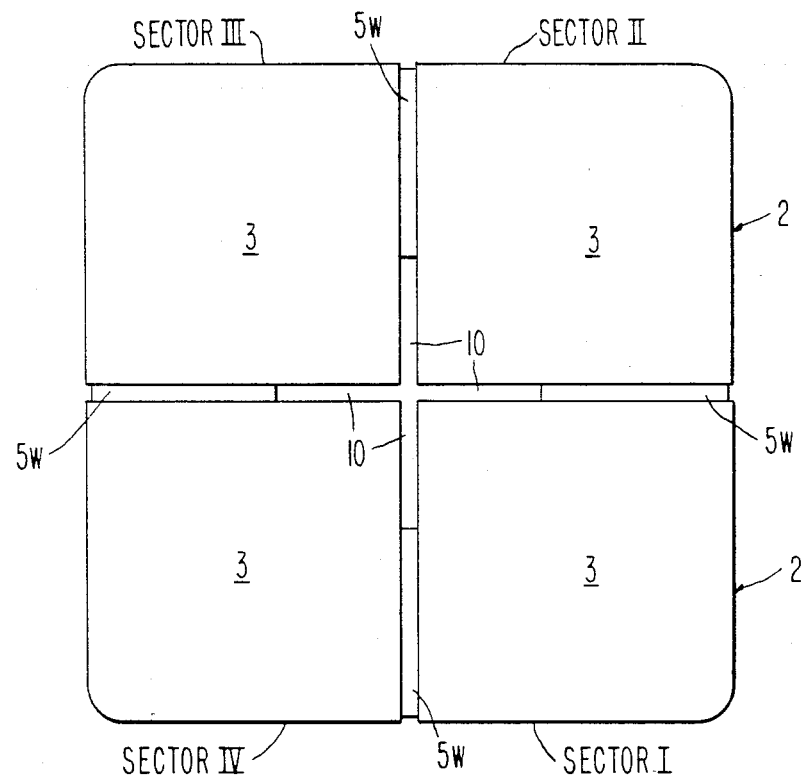
FIG. 4 is an underside drawing of the baseplate of the heat sink illustrating the sectors connected by the bridging fins.

FIG. 4 indicates the contact area 3 in each sector such that the side lengths are reduced by the occurrence of the gaps 10.

The heat sink provided herein involves a multi-faceted heat sink device divided into sectors wherein each sector has a multiplicity of radially oriented fin-like elements of alternating longer and shorter fins. Each set of fins resides on the base plate in a sector or quadrant arrangement whereby each sector is separated from the other by a spatial gap at the base plate level but is connected by a bridge fin element which connects both sides of the adjacent quadrants.

The overall effect of this relationship is to provide a highly efficient cooling area through which cooling impingement air can be directed to the central area of the base plate and thence through the multi faceted fin elements while the bond or adhesive connection between the base plate of the heat sink and the top surface of the integrated circuit package can still be maintained without undue stress because the sector structure and bridging fin elements reduce or lessen the thermal stress on the base plate 2 so that little possibility exists that the bond between the baseplate and the top of the integrated circuit package will ever be severed, broken or degraded.

While the described embodiment provides a particular version of the stress relieving concept, there may be other configurations which fall within this disclosure and which are emcompassed by the following claims.

What is claimed is:

1. A heat sink device for facilitating a stress-reduced bond between the heat sink and the contacting surface of an integrated circuit package, said device for placement perpendicular to an impinging air flow, said heat sink device comprising:
   (a) a metallic base plate divided into sectors by mid-position cutouts on each peripheral edge and attachable to an integrated circuit package unit, and supporting a plurality of metallic fin elements wherein said base plate includes:
      (a1) a central cylindrical opening area at the base plate for the purpose of receiving and dispersing said impinging air flow directed perpendicular to said base plate;
      (a2) a plurality of metallic fin elements supported perpendicular to said base plate which are situated in a radial orientation from the center of said base plate and which are truncated at the center area of said base plate in order to provide said central opening area; said plurality of metallic fin elements being equally spaced around the said peripheral edges of said base plate such that said fin elements constitute a fixed pattern of different lengths oriented in the radial direction in order to form a repetitive sector pattern, wherein said repetitive sector pattern includes:
      (a2a) a sequence of said radial fin element lengths which follow the pattern of long - short - intermediate - short, and which pattern repeates throughout each sector of the base plate of said heat sink device such that the width-thickness of each of said plurality of fin elements is of the same dimension and width as each of the air space interstices between adjacent fin elements;
      (a3) and wherein each peripheral edge of said base plate has a mid-position cutout oriented in the radial direction which establishes a first side and a second side for said cutout;
      (a4) a plurality of radial fin bridging elements of inverted "U-shaped" form, each of which provides first and second vertical legs for connection to said first side and the said second side of said mid-position cutouts thus effectively diminishing the contact length of each of said peripheral edges.

2. A radially finned heat sink device for facilitating a stress-reduced bond between the heat sink and the contacting surface of an integrated circuit package, said heat sink device comprising:
   (a) a plurality of radially oriented heat conductive fin elements evenly spaced around the periphery of a base plate, and having radial air-gaps therebetween; and wherein
      (a1) said radial air-gaps have a width at said periphery which is substantially equal to the width of each of said fin elements; and
      (a2) said fin elements follow a repetitive pattern of lengths of "long-short-medium-short"; and
      (a3) said long length fin elements being truncated near the center of said base plate to form a central chamber-like cylindrical space for receiving impinging air flow directed perpendicular to said base plate;
   (b) said base plate for supporting said heat conductive fin elements and fabricated of heat conductive material having a flat underside for juxtaposition to said integrated circuit package and wherein said base plate includes:
      (b1) a plurality of peripheral edges wherein each peripheral edge has a mid-position cutout in the radial direction which establishes a first side and a second side for said coutout;
      (b2) a plurality of finned bridging elements of inverted "U-shaped" form each of which provides a first and second connecting leg to said first side and said second side of said mid-position cutouts thus effectively diminishing the contact length of each of said peripheral edges.

3. The heat sink device of claim 2 wherein said mid-position cutout of each of said peripheral edges divides said base plate into equal size sectors.

* * * * *